(12) United States Patent
Abel et al.

(10) Patent No.: US 12,444,610 B2
(45) Date of Patent: Oct. 14, 2025

(54) METHODS FOR ETCHING A SUBSTRATE USING A HYBRID WET ATOMIC LAYER ETCHING PROCESS

(71) Applicant: Tokyo Electron Limited, Tokyo (JP)

(72) Inventors: Paul Abel, Austin, TX (US); Jacques Faguet, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 565 days.

(21) Appl. No.: 17/580,879

(22) Filed: Jan. 21, 2022

(65) Prior Publication Data

US 2022/0148882 A1 May 12, 2022

Related U.S. Application Data

(63) Continuation-in-part of application No. 16/402,611, filed on May 3, 2019, now Pat. No. 11,437,250.
(Continued)

(51) Int. Cl.
*H01L 21/306* (2006.01)
*H01L 21/3213* (2006.01)

(52) U.S. Cl.
CPC .. *H01L 21/30604* (2013.01); *H01L 21/32134* (2013.01); *H01L 21/32133* (2013.01)

(58) Field of Classification Search
CPC ......... H01L 21/30604; H01L 21/32134; H01L 21/32133
See application file for complete search history.

(56) References Cited

U.S. PATENT DOCUMENTS

| 5,374,328 A | 12/1994 | Remba et al. |
| 6,513,537 B1 * | 2/2003 | Orii .......................... G03F 7/405 438/720 |

(Continued)

FOREIGN PATENT DOCUMENTS

| JP | 2001203181 | 7/2001 |
| JP | 2006019523 | 1/2006 |

(Continued)

OTHER PUBLICATIONS

Chan et al., "Sputtering power and deposition pressure effects on the electrical and structural properties of copper thin films," Journal of Materials Science, vol. 40, pp. 5971-5981. (Year: 2005).*

(Continued)

*Primary Examiner* — Brent A. Fairbanks
*Assistant Examiner* — Michael Anguiano
(74) *Attorney, Agent, or Firm* — Egan, Enders & Huston LLP.

(57) ABSTRACT

The present disclosure provides a hybrid atomic layer etching (ALE) process that combines a gas-phase surface modification step with a liquid-phase dissolution step for etching an exposed material on a substrate disposed within a process chamber. In the hybrid ALE process disclosed herein, a gas-phase reactant is used to modify an exposed surface of the material to create a modified surface layer, and one or more liquid-phase reactants are used to selectively dissolve the modified surface layer without dissolving the material underlying the modified surface layer. Once the modified surface layer is selectively dissolved, the substrate may be dried and the gas-phase surface modification and liquid-phase dissolution steps may be repeated for one or more ALE cycles until a desired amount of the material is etched.

19 Claims, 6 Drawing Sheets

Related U.S. Application Data which is a continuation-in-part of application No. 16/287,658, filed on Feb. 27, 2019, now Pat. No. 10,982,335.

(60) Provisional application No. 63/151,579, filed on Feb. 19, 2021, provisional application No. 62/767,808, filed on Nov. 15, 2018.

(56) References Cited

U.S. PATENT DOCUMENTS

| | | | |
|---|---|---|---|
| 6,616,014 B1 | 9/2003 | Pozniak et al. | |
| 6,841,031 B2 | 1/2005 | Iwata et al. | |
| 6,896,600 B1 | 5/2005 | Wu et al. | |
| 10,157,756 B2 | 12/2018 | Yamada | |
| 10,982,335 B2 | 4/2021 | Abel | |
| 2002/0004303 A1 | 1/2002 | Agnello | |
| 2003/0087528 A1 | 5/2003 | Kruwinus | |
| 2004/0092106 A1* | 5/2004 | Martyak | H01L 21/3212 438/689 |
| 2006/0289389 A1 | 12/2006 | Shea | |
| 2007/0269977 A1* | 11/2007 | Chikaki | H01L 21/76883 438/638 |
| 2009/0007938 A1 | 1/2009 | Dubreuil et al. | |
| 2009/0047790 A1 | 2/2009 | Raghu et al. | |
| 2010/0105595 A1* | 4/2010 | Lee | H01L 21/02063 510/176 |
| 2010/0279435 A1 | 11/2010 | Xu et al. | |
| 2011/0094888 A1 | 4/2011 | Chen et al. | |
| 2012/0031768 A1 | 2/2012 | Reid et al. | |
| 2014/0199840 A1 | 7/2014 | Bajaj et al. | |
| 2014/0370643 A1 | 12/2014 | Stern et al. | |
| 2016/0089686 A1 | 3/2016 | Lee et al. | |
| 2016/0141210 A1 | 5/2016 | Lei et al. | |
| 2016/0372320 A1 | 12/2016 | Emoto | |
| 2017/0243755 A1 | 8/2017 | Tapily | |
| 2017/0356084 A1 | 12/2017 | Nakanishi et al. | |
| 2018/0090352 A1 | 3/2018 | Sotoku et al. | |
| 2018/0226278 A1 | 8/2018 | Arnepalli et al. | |
| 2018/0233325 A1 | 8/2018 | Kanarik et al. | |
| 2018/0269307 A1* | 9/2018 | Chen | H01L 29/66795 |
| 2018/0374936 A1 | 12/2018 | Kelly et al. | |
| 2019/0011734 A1 | 1/2019 | Otsuji | |
| 2019/0027383 A1 | 1/2019 | Nakai et al. | |
| 2019/0148192 A1 | 5/2019 | Yamaguchi | |
| 2020/0157693 A1 | 5/2020 | Abel | |
| 2020/0161148 A1 | 5/2020 | Abel | |
| 2020/0312620 A1 | 10/2020 | Blomberg et al. | |
| 2020/0312670 A1 | 10/2020 | Smith et al. | |
| 2021/0324525 A1* | 10/2021 | Das | C23F 1/38 |
| 2022/0199422 A1* | 6/2022 | Yang | H01L 21/32139 |

FOREIGN PATENT DOCUMENTS

| | | |
|---|---|---|
| KR | 1020170022922 | 3/2017 |
| KR | 1020170077839 | 7/2017 |
| WO | 2018004649 | 1/2018 |
| WO | 2020102655 | 5/2020 |

OTHER PUBLICATIONS

International Search Report issued in Application No. PCT/US2019/061683, Mar. 13, 2020, 9 pgs.

International Search Report Issued in Application No. PCT/US2019/061678, Mar. 13, 2020, 8 pgs.

Faguet et al., "Dynamically Adjusted Purge Timing In Wet Atomic Layer Etching", U.S. Appl. No. 17/580,936, filed Jan. 21, 2022, 49 pgs.

Abel et al., "Systems For Etching A Substrate Using A Hybrid Wet Atomic Layer Etching Process", U.S. Appl. No. 17/584,667, filed Jan. 26, 2022, 48 pgs.

International Search Report, PCT/US2022/014540, May 16, 2022, 11 pgs.

Itoh et al., Japan Patent Application No. 2023-549864, Office Action dated Aug. 19, 2025, 6 pgs.

Abel et al., "Methods For Etching A Substrate Using A Hybrid Wet Atomic Layer Etching Process", Korean Patent Application No. 10-2023-7026849, Filed Aug. 7, 2023, Office Action dated Jun. 12, 2025, 19 pgs.

Abel et al., "Methods For Etching A Substrate Using A Hybrid Wet Atomic Layer Etching Process", Filed Feb. 15, 2022, Application No. 111105390, TW Office Action Apr. 28, 2025, 11 pgs.

* cited by examiner

METHODS FOR ETCHING A SUBSTRATE USING A HYBRID WET ATOMIC LAYER ETCHING PROCESS

This application claims priority to U.S. Provisional Patent Application Ser. No. 63/151,579, filed Feb. 19, 2021, entitled "Hybrid Wet Atomic Layer Etching"; the disclosure of which is expressly incorporated herein, in their entirety, by reference. This application further claims priority to, and is a continuation-in-part of, U.S. patent application Ser. No. 16/402,611, filed May 3, 2019, entitled "Processing System and Platform for Wet Atomic Layer Etching Using Self-Limiting and Solubility-Limited Reactions," which is a continuation-in-part application of U.S. patent application Ser. No. 16/287,658, filed Feb. 27, 2019, entitled "Wet Atomic Layer Etching Using Self-Limiting and Solubility-Limited Reactions," now U.S. Pat. No. 10,982,335, which claims priority to U.S. Provisional Patent Application No. 62/767,808, entitled, "Wet Atomic Layer Etching Using Self-Limiting and Solubility-Limited Reactions" filed Nov. 15, 2018; the disclosure of which are expressly incorporated herein, in their entirety, by reference.

BACKGROUND

The present disclosure relates to the processing of substrates. In particular, it provides a method of etching of layers on substrates.

As geometries of substrate structures continue to shrink and the types of structures evolve, the challenges of etching substrates have increased. One technique that has been utilized to address these challenges is atomic layer etching (ALE). ALE processes are generally known to involve processes which remove thin layers sequentially through one or more self-limiting reactions. For example, ALE typically refers to techniques that can etch with atomic precision, i.e., by removing material one or a few monolayers at a time. ALE processes generally rely on a chemical modification of the surface to be etched followed by a selective removal of the modified layer. Thus, ALE processes offer improved performance by decoupling the etch process into sequential steps of surface modification and removal of the modified surface. Such processes often include multiple cyclic series of layer modification and etch steps, where the modification step modifies the exposed surfaces and the etch step selectively removes the modified layer. Thus, in some ALE processes, a series of self-limiting reactions may occur and the cycle may be repeatedly performed.

A variety of ALE processes are known, including plasma ALE, thermal ALE and wet ALE techniques. In plasma ALE, a target substrate disposed within a process chamber is exposed to a reactive precursor, which adsorbs on and reacts with the exposed surfaces of the target substrate to modify the surface in a surface modification step. The exposed surfaces of the target substrate are then bombarded with low energy non-reactive ions (e.g., from an inert gas) to remove the modified surface layer in a subsequent etch step. Some plasma ALE processes use a cyclic pulsing of process gases (e.g., reactive precursor gas(es) and an inert gas(es)) within one or more ALE cycles—where each ALE cycle consists of at least one surface modification step and etch step—to remove material from the surface of the target substrate. In plasma ALE, operating variables (e.g., the chamber temperature, chamber pressure, flowrates of process gases, types of process gases, and/or other operating variables) can be adjusted to control the surface modification and etch process steps. In some cases, a plasma ALE process may be performed at relatively high temperature and/or pressure. In plasma ALE, the process chamber is often purged after each surface modification step and after each etch step to avoid mixing reactive precursors and inert gases within the process chamber. This increases the cycle time and reduces throughput.

In thermal ALE, the modified layer is removed through volatilization when material is taken from the solid phase into the gas phase. This phase change requires the addition of latent heat and is limited by the vapor pressure of the modified layer. Thermal energy is used to replace the intermolecular interactions that stabilize the modified layer on the surface. In thermal ALE, high temperatures are often required to remove the modified layer.

In wet ALE, material is removed from a surface in a cyclic process utilizing self-limiting and selective reactions. The name "wet ALE" indicates that some, if not all, of the reactions take place in the liquid phase. One advantage of wet ALE over thermal or plasma ALE techniques is that wet ALE processes can be run at atmospheric temperature and pressure.

The wet ALE process begins with a self-limiting surface modification step, which can be achieved through oxidation, reduction, ligand binding, or ligand exchange. Ideally, the modified layer is confined to the top monolayer of the material and acts as a passivation layer to prevent the modification reaction from progressing further. The second step of the wet ALE process is selective dissolution of the modified layer. The process must dissolve the modified layer without removing any of the underlying unmodified material. This can be accomplished by using a different solvent in the second step than was used in the first step, changing the pH, or changing the concentration of other components in the first solvent.

In wet ALE, purge steps are performed in between the surface modification step and the selective dissolution step, typically by rinsing the modified surface layer with a purge solution to remove excess reactants. The purpose of the purge step is to ensure that there is no mixing between the solution used for surface modification and the solution used for dissolution. If these two solutions mix, it is possible that solution mixture can both modify and dissolve the substrate. Mixing the solutions prevents the modification reaction from being self-limiting and lead to continuous etching. Continuous etches tend to preferentially etch at grain boundaries, which results in a rough post-etch surface.

Being an atomic layer process, wet ALE tends to be slow. Each reaction must have enough time to be driven to saturation and each purge step must be sufficient to completely separate the surface modification solution and the dissolution solution. This can lead to low throughput in high volume manufacturing (HVM) making wet ALE an expensive process.

SUMMARY

One advantage of wet ALE over thermal or plasma ALE techniques is that a wet ALE process can be run at atmospheric temperature and pressure. Gas-phase reactants, condensates, sprays or mists can be used in a wet ALE process while maintaining these advantages as long as the reactants are delivered near room temperature and near atmospheric pressure. For ALE of metals, oxidation is often used as a surface modification step, and many self-limiting oxidation processes occur on metal surfaces using room temperature, atmospheric pressure reactants.

As described further herein, the present disclosure maintains the advantages of wet ALE (e.g., self-limiting reactions at near atmospheric pressure and temperature, smoothing of the post-etch surface, digital control over the total etch amount, etc.), while avoiding the disadvantages thereof (e.g., low throughput, high cost, etc.), by providing a hybrid wet ALE process that combines a gas-phase surface modification step with a liquid-phase dissolution step for etching a substrate disposed within a process chamber. In the hybrid ALE process described herein, a gas-phase reactant is used to modify an exposed surface of a material to create a modified surface layer, and one or more liquid-phase reactants are used to selectively dissolve the modified surface layer without dissolving the material underlying the modified surface layer. Once the modified surface layer is selectively dissolved, the substrate may be dried and the gas-phase surface modification and liquid-phase dissolution steps may be repeated for one or more ALE cycles until a desired amount of the material is etched.

In some embodiments, the exposed surface of the material may be exposed to the gas-phase reactant and the liquid-phase reactant(s) in sequence. In other embodiments, the exposed surface of the material may be exposed to the liquid-phase reactant(s), while a gas-phase reactant is supplied to the process chamber. When a liquid-phase reactant is dispensed in the presence of a gas-phase reactant, the liquid-phase reactant dispensed onto the exposed surface of the material displaces the gas-phase reactant from the exposed surface to prevent further surface modification of the exposed surface. When dispensed in such a manner, the liquid-phase reactant not only dissolves the modified surface layer, but also partitions the gas-phase surface modification and liquid-phase dissolution steps. This decreases the cycle time and improves the throughput of the hybrid ALE process described herein, compared to other ALE techniques, by avoiding the need to perform a purge step between the surface modification and dissolution steps.

Cycle time and throughput may be further improved in the hybrid ALE process described herein by performing the gas-phase surface modification and liquid-phase dissolution steps within the same process chamber. In one example implementation, the gas-phase surface modification and liquid-phase dissolution steps may both be performed within a spin chamber. In some embodiments, the gas-phase surface modification and liquid-phase dissolution steps may be performed within the same process chamber at roughly the same temperature and pressure. In one example implementation, the gas-phase surface modification and liquid-phase dissolution steps may be performed at (or near) atmospheric pressure and room temperature. Performing the gas-phase surface modification and liquid-phase dissolution steps within the same process chamber at roughly the same temperature and pressure decreases the cycle time and improves the throughput of the hybrid ALE process described herein by avoiding unnecessary chamber transitions and temperature/pressure changes.

The hybrid ALE process described herein may be used for etching a wide variety of materials including polycrystalline materials, single-crystalline materials and amorphous materials. In some embodiments, the hybrid ALE process described herein may be used for etching a polycrystalline material, such as a transition metal (such as, e.g., molybdenum, Mo), and a gas-phase oxidizing agent (e.g., oxygen, $O_2$, or ozone, $O_3$) may be used to oxidize an exposed surface of the transition metal to form a self-limiting oxidized layer (such as, e.g., $MoO_3$). The oxidation of transition metals, such as molybdenum, is self-limiting at (or near) room temperature. After the exposed surface of the transition metal is exposed to the gas-phase oxidizing agent and the oxidized layer is formed, a liquid-phase reactant may be dispensed onto the substrate to selectively dissolve the oxidized layer, so that the oxidized layer is removed without etching the underlying polycrystalline material. Several chemistries can be used to selectively dissolve molybdenum oxides (e.g., $MoO_3$) without dissolving metallic Mo are described in more detail below.

Example process conditions (e.g., etch chemistry, temperature, pressure, etc.) are provided herein for etching transition metals, and more specifically, for etching molybdenum using the hybrid ALE process described herein. It will be recognized by those skilled in the art, however, that the disclosed process is not strictly limited to the example process conditions described herein and may be performed using a wide variety of process conditions depending on the material being etched. In general, the hybrid ALE process described herein may use a minimum pressure, which is greater than the vapor pressure of the liquid-phase reactant used to remove and/or dissolve the modified surface layer. However, the temperature used in the hybrid ALE process described herein may generally range between the melting point and the boiling point of the liquid-phase reactant.

Thus, in some embodiments of the present disclosure, atmospheric pressure, room temperature, gas-phase reactants (or, condensates, sprays or mists) may be added to the wet ALE process to create a hybrid ALE process, which improves upon other ALE techniques by decreasing cycle time and increasing throughput while maintaining the advantages of conventional wet ALE.

A method is provided herein for etching a substrate using a hybrid atomic layer etching (ALE) process according to a first embodiment of the present disclosure. In the first embodiment, the method comprises: receiving the substrate, the substrate having a material exposed; and selectively etching the material by performing multiple cycles of the hybrid ALE process, wherein each cycle includes: a) performing a gas-phase surface modification step to chemically modify an exposed surface of the material and provide a modified surface layer, wherein the gas-phase surface modification step includes exposing the substrate to a gas-phase reactant to chemically modify the exposed surface of the material; and b) performing a liquid-phase dissolution step to selectively dissolve the modified surface layer of the material, wherein the liquid-phase dissolution step includes dispensing one or more liquid-phase reactants onto a surface of the substrate to dissolve the modified surface layer. In the first embodiment, the one or more liquid-phase reactants are dispensed onto the surface of the substrate while the substrate is exposed to the gas-phase reactant. In doing so, the one or more liquid-phase reactants partition the gas-phase surface modification step and the liquid-phase dissolution step by displacing the gas-phase reactant from the surface of the substrate.

In some embodiments, said a) performing a gas-phase surface modification step may include exposing the substrate to a gas-phase oxidizing agent to oxidize the exposed surface of the material and form a self-limiting oxidized layer. In such embodiments, said b) performing a liquid-phase dissolution step may include dispensing a complexing agent dissolved in a first liquid solvent onto the surface of the substrate, wherein the complexing agent binds to the self-limiting oxidized layer to form a ligand-metal complex. In addition, said b) performing a liquid-phase dissolution step may include dispensing a second liquid solvent onto the surface of the substrate to dissolve the ligand-metal complex and remove the self-limiting oxidized layer. In some embodiments, the first liquid solvent and the second liquid solvent may be the same solvent. In other embodiments, the first liquid solvent and the second liquid solvent may be different solvents.

In some embodiments, each cycle of the hybrid ALE process may further include drying the surface of the substrate after the liquid-phase dissolution step is performed to selectively dissolve the modified surface layer of the material. For example, said drying the surface of the substrate may include spin-drying the substrate to flush the one or more liquid-phase reactants from the surface of the substrate and re-expose the exposed surface of the material to the gas-phase reactant in a subsequent gas-phase surface modification step.

Another method is provided herein for etching a substrate using a hybrid atomic layer etching (ALE) process according to a second embodiment of the present disclosure. In the second embodiment, the method comprises: receiving the substrate, the substrate having a polycrystalline material exposed; and selectively etching the polycrystalline material by performing multiple cycles of the hybrid ALE process, wherein each cycle includes: a) chemically modifying an exposed surface of the polycrystalline material to provide a modified surface layer, wherein said exposed surface is chemically modified by oxidation of the polycrystalline material using a gas-phase oxidizing agent; b) binding a complexing agent to the modified surface layer of the polycrystalline material to provide a complex-bound modified surface layer; and c) selectively removing the complex-bound modified surface layer of the polycrystalline material by exposing the complex-bound modified surface layer to a liquid solvent, which dissolves the complex-bound modified surface layer without dissolving the polycrystalline material underlying the complex-bound modified surface layer. In some embodiments, the steps a)-c) may be repeated at least once.

Yet another method is provided herein for etching a substrate using a hybrid atomic layer etching (ALE) process according to a third embodiment of the present disclosure. In the third embodiment, the method comprises: receiving the substrate, the substrate having a molybdenum (Mo) metal exposed; and selectively etching the Mo metal by performing multiple cycles of the hybrid ALE process, wherein each cycle comprises: a) chemically modifying an exposed surface of the Mo metal to provide a modified surface layer, wherein said exposed surface is chemically modified by oxidation of the Mo metal using a gas-phase oxidizing agent containing ozone; b) binding a complexing agent to the modified surface layer of the Mo metal to provide a complex-bound modified surface layer; and c) selectively removing the complex-bound modified surface layer of the Mo metal by exposing the complex-bound modified surface layer to a liquid solvent, which dissolves the complex-bound modified surface layer without dissolving the Mo metal underlying the complex-bound modified surface layer. In some embodiments, the steps a)-c) may be repeated at least once.

In the methods disclosed in the second and third embodiments, the order and/or timing of the steps a)-c) performed during each cycle of the hybrid ALE process may sometimes differ. In one embodiment, for example, steps b) and c) may be performed sequentially with no temporal overlap during each cycle of the hybrid ALE process. In such an embodiment, the complexing agent may be dissolved in a first liquid solvent, which differs from the liquid solvent used to dissolve the complex-bound modified surface layer, and the complex-bound modified surface layer may be insoluble in the first liquid solvent and soluble in the liquid solvent.

In another other embodiment, two or more of the steps a)-c) may be combined during each cycle of the hybrid ALE process. For example, steps b) and c) may be performed with at least partial temporal overlap during each cycle of the hybrid ALE process. In such an embodiment, the liquid solvent may contain the complexing agent, and the complex-bound modified surface layer may be soluble in the liquid solvent.

In some embodiments, the methods disclosed in the second and third embodiments may further comprise: d) rinsing the substrate to remove excess liquid solvent and unbound complexing agent; and e) drying the substrate using a gas stream, a spin dry step and/or a drying agent. In some embodiments, the steps a)-e) may be repeated at least once.

The methods disclosed herein may be used to etch a wide variety of materials, including polycrystalline materials, single-crystalline materials and amorphous materials. In some embodiments, the methods disclosed herein may be used to etch a polycrystalline metal material such as, for example, a transition metal. Examples of transition metals that may be etched using the methods disclosed herein include, but are not limited to, molybdenum (Mo), tungsten (W), vanadium (V), niobium (Nb), tantalum (Ta), and chromium (Cr).

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
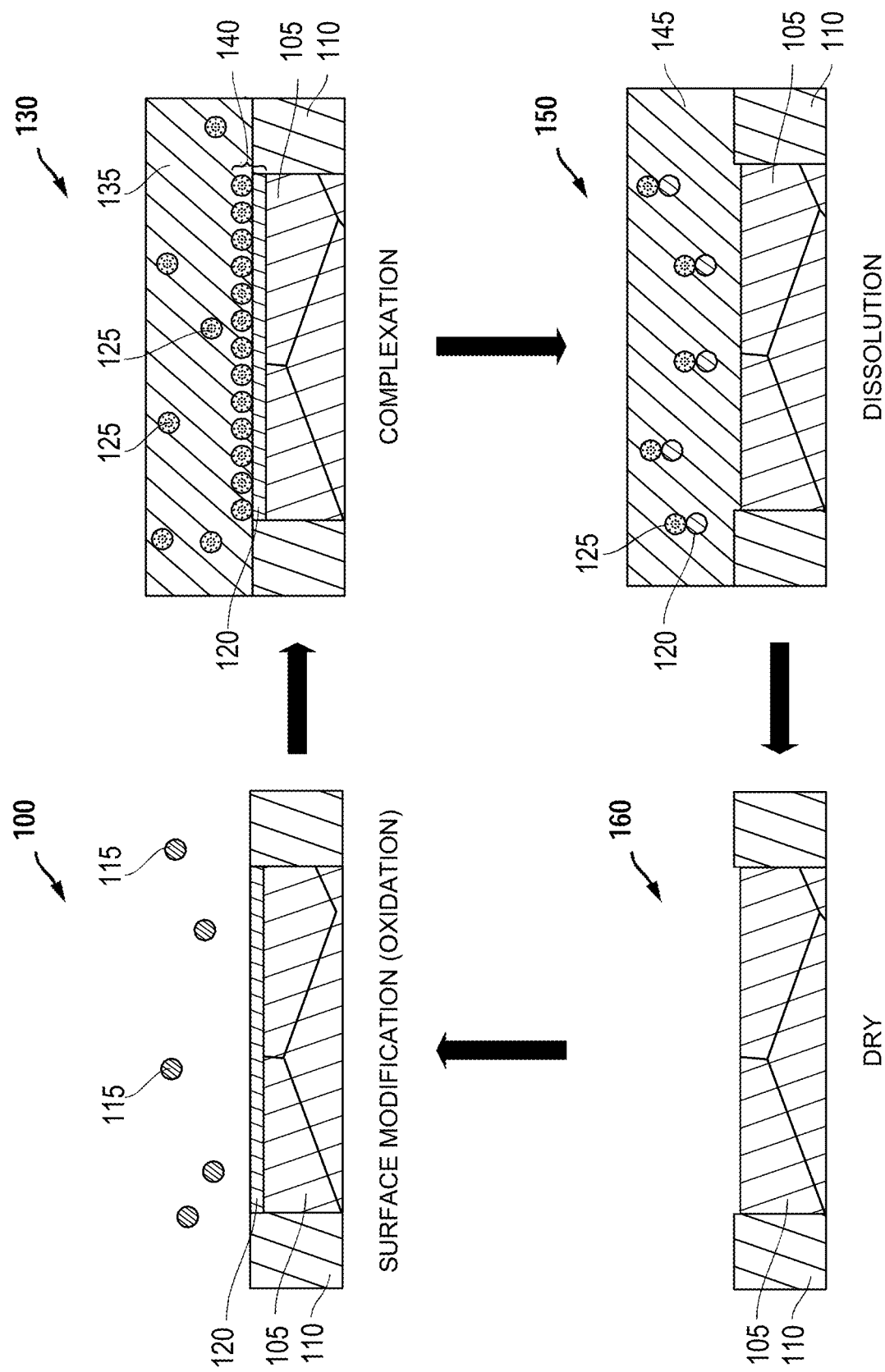
FIG. 1 illustrates one example of a cyclic hybrid atomic layer etching (ALE) process in accordance with the present disclosure.

Chemical reactions on surfaces can proceed using either vapor-phase reactants or liquid-phase reactants in contact with the surface. Wet ALE typically relies on reactions between a surface and liquid-phase reactants, but vapor-phase reactants can also be used to deliver reactants to the surface. Sequential reactions can also be accomplished by utilizing reactants from different phases, such as a gas-phase reactant followed by a liquid-phase reactant (or vice versa). The present disclosure utilizes these concepts to provide a hybrid ALE process, which maintains the advantages of wet ALE, while avoiding the disadvantages thereof.

In the hybrid ALE process described herein, a gas-phase reactant is used to modify an exposed surface of a material to create a modified surface layer, and a liquid-phase reactant is used to selectively dissolve the modified surface layer without dissolving the material underlying the modified surface layer. Once the modified surface layer is selectively dissolved, the substrate may be dried and the gas-phase surface modification and liquid-phase dissolution steps may be repeated for one or more ALE cycles until a desired amount of the material is etched.

In some embodiments, the exposed surface of the material may be exposed to the gas-phase reactant and the liquid-phase reactant in sequence. In other embodiments, the exposed surface of the material may be exposed to a liquid-phase reactant, while a gas-phase reactant is supplied to the process chamber. When a liquid-phase reactant is dispensed in the presence of a gas-phase reactant, the liquid-phase reactant dispensed onto the exposed surface of the material displaces the gas-phase reactant from the exposed surface to prevent further surface modification of the exposed surface. When dispensed in such a manner, the liquid-phase reactant not only dissolves the modified surface layer, but also partitions the gas-phase surface modification and liquid-phase dissolution steps. This decreases the cycle time and improves the throughput of the hybrid ALE process described herein, compared to other ALE techniques, by avoiding the need to perform a purge step between the surface modification and dissolution steps.

Cycle time and throughput may be further improved in the hybrid ALE process described herein by performing the gas-phase surface modification and liquid-phase dissolution steps within the same process chamber. In one example implementation, the gas-phase surface modification and liquid-phase dissolution steps may both be performed within a spin chamber. In some embodiments, the gas-phase surface modification and liquid-phase dissolution steps may be performed within the same process chamber at roughly the same temperature and pressure. In one example implementation, the gas-phase surface modification and liquid-phase dissolution steps may be performed at (or near) atmospheric pressure and room temperature. Performing the gas-phase surface modification and liquid-phase dissolution steps within the same process chamber at roughly the same temperature and pressure decreases the cycle time and improves the throughput of the hybrid ALE process described herein by avoiding unnecessary chamber transitions and temperature/pressure changes.

The techniques described herein offer multiple advantages over other etch techniques. For example, the techniques described herein provide the benefits of ALE, such as precise control of total etch amount, control of surface roughness, and improvements in wafer-scale uniformity. The techniques described herein also provide various benefits of wet etching, such as the simplicity of the etch chamber, self-limiting reactions at near atmospheric temperature and pressure etching conditions, and reduced surface roughness. Unlike conventional wet ALE processes, which tend to be slow, the techniques described herein provide a hybrid ALE process that improves cycle time and throughput by combining a gas-phase surface modification step with a liquid-phase dissolution step.

The techniques described herein may be performed on a wide variety of substrates having a wide variety of layers and features formed thereon. In general, the substrates utilized with the techniques disclosed herein may be any substrates for which the etching of material is desirable. For example, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

The techniques described herein may be used to etch a wide variety of materials. Such materials may include polycrystalline materials, single-crystalline materials and amorphous materials. In some embodiments, the techniques described herein may be used to etch a metal material such as, but not limited to, transition metals and noble metals. In one exemplary embodiment, the material to be etched may be a polycrystalline transition metal such as, for example, molybdenum (Mo). Although the techniques described herein are discussed below with relation to etching molybdenum, it will be recognized by those skilled in the art that such an example is merely exemplary and the techniques described herein may be used to etch a wide variety of other materials. For example, the techniques described herein may be used to etch other transition metals such as, but not limited to, tungsten (W), vanadium (V), niobium (Nb), tantalum (Ta), and chromium (Cr).

FIG. 1 illustrates one example of a hybrid ALE process in accordance with the present disclosure. More specifically, FIG. 1 illustrates exemplary steps performed during one cycle of a hybrid ALE process. In the process shown in FIG. 1, a polycrystalline material 105 surrounded by a dielectric material 110 is exposed to a gas-phase reactant 115 during a surface modification step 100 to modify exposed surfaces of the polycrystalline material 105 and create a modified surface layer 120. In some embodiments, the polycrystalline material 105 to be etched can be, e.g., a transition metal. In one example embodiment, the polycrystalline material 105 may include molybdenum (Mo). In some embodiments, the gas-phase reactant 115 may be included within oxygen-containing gaseous environment. For example, the gas-phase reactant 115 may be a gas-phase oxidizing agent including, for example, oxygen ($O_2$), ozone ($O_3$), nitrogen dioxide ($NO_2$) and/or a halogen gas. When exposed surfaces of the polycrystalline material 105 are exposed to the oxygen-containing gaseous environment, or the gas-phase oxidizing agent included therein, the exposed surfaces are oxidized to form a self-limiting oxidized layer (e.g., a molybdenum oxide, such as $MoO_3$) overlying the unmodified polycrystalline material.

Oxidation is often used as a surface modification step in ALE. Many oxidizers such as oxygen ($O_2$) and ozone ($O_3$)

are easy to deliver at atmospheric pressure and room temperature. These oxidizers will form self-limiting oxide layers on many materials, such as metals, at room temperature. Although not strictly limited to such, these metals can include transition metals, and more specifically, polycrystalline transition metals such as, for example, molybdenum (Mo) metal.

In the surface modification step 100 shown in FIG. 1, a chemical reaction (e.g., oxidation) occurs at the exposed surface of the polycrystalline material 105 to form the modified surface layer 120 (e.g., a self-limiting oxidized layer, such as a molybdenum oxide). In some cases, the reaction may be fast and self-limiting—i.e., the reaction product may modify one or more monolayers of the exposed surface of the polycrystalline material 105, but may prevent any further reaction between the gas-phase reactant 115 and the underlying polycrystalline material 105.

In some embodiments, the modified surface layer 120 may be exposed to one or more liquid-phase reactants to selectively dissolve the modified surface layer 120. For example, the modified surface layer 120 may be exposed to a complexing agent 125 dissolved in a liquid solvent 135 (e.g., an aqueous or non-aqueous solution) during a complexation step 130. In the complexation step 130, the complexing agent 125 (e.g., a carboxylate-based ligand) binds to the modified surface layer 120 (e.g., a self-limiting oxidized layer) to form a ligand-metal complex 140. In some embodiments, the complexing agent 125 may include a ligand (e.g., α-benzoin oxime), which selectively binds to higher oxidation states of the polycrystalline material 105 (e.g., $Mo^{6+}$) and causes the modified surface layer 120 (e.g., $MoO_3$) to react with the ligand dissolved in the liquid solvent 135 to form a ligand-metal complex 140 that is soluble in a subsequent dissolution step 150. However, non-selective ligands can also be used to bind to the modified surface layer 120 and form a ligand-metal complex 140, as described in more detail below.

After oxidation and complexation, the polycrystalline material 105 is brought in contact with a liquid solvent 145 in dissolution step 150 to selectively dissolve the modified surface layer 120 (e.g., $MoO_3$) without dissolving the underlying polycrystalline material 105 (e.g., metallic Mo). This can be accomplished through one of two distinct methodologies: reactive dissolution or ligand binding followed by dissolution.

In reactive dissolution, the ligand is dissolved in a liquid solvent 135 that can dissolve both the ligand and the ligand-metal complex 140 in the dissolution step 150. This enables ligand binding and dissolution to be accomplished using a single solvent 135/145. Thus, in reactive dissolution, the ligand binding and dissolution steps have at least partial temporal overlap.

In the reactive dissolution method, the modified surface layer 120 (e.g., $MoO_3$) reacts with the ligand in the liquid solvent 135/145 to form a soluble ligand-metal complex 140, which dissolves in the liquid solvent 135/145 to remove the modified surface layer 120. Any thickness of the modified surface layer 120 (e.g., $MoO_3$) can be removed using this method. Selectivity comes from the ability of the ligand to bind to higher oxidation states of the polycrystalline material 105 (e.g., $Mo^{6+}$), but not to lower oxidation states or unmodified portions of the polycrystalline material 105. Reactive dissolution is not self-limiting, so the oxidation step must be self-limiting for the overall process to remain so.

In the ligand binding followed by dissolution method, the ligand binding and dissolution steps have no temporal overlap. In this method, the ligand is dissolved in a liquid solvent 135 in which the ligand-metal complex 140 is insoluble. The ligand within the liquid solvent 135 reacts with the modified surface layer 120 (e.g., $MoO_3$) to form an insoluble layer of ligand-metal complex 140. This layer is dissolved in the dissolution step 150 when the surface is rinsed with a different liquid solvent 145 in which the ligand-metal complex 140 is soluble. In the ligand binding followed by dissolution method, removal of the modified surface layer 120 (e.g., $MoO_3$) is limited by ligand packing density on the surface. The ligand binding in complexation step 130, and therefore, the dissolution of the ligand-metal complex 140 in the dissolution step 150, is self-limiting.

Once the modified surface layer 120 is dissolved, the ALE etch cycle may be completed by drying the surface of the substrate in a drying step 160. In one embodiment, the surface of the substrate may be dried in step 160 by supplying a gas stream of air or nitrogen to the substrate. In another embodiment, the surface of the substrate may be dried in step 160 by performing a spin dry step. In some embodiments, a drying aid (such as, e.g., isopropyl alcohol, IPA) may be dispensed onto the surface of the substrate (not shown in FIG. 1) to further assist in drying the substrate before performing a spin dry step. Once the surface of the substrate is dry, the surface modification step 100, complexation step 130, dissolution step 150 and drying step 160 shown in FIG. 1 may be repeated for one or more ALE cycles until a desired amount of the polycrystalline material 105 has been removed.

As noted above, the hybrid ALE cycle shown in FIG. 1 may be used for Mo etching, in some embodiments. In this etch scheme, oxidation may be accomplished by exposing the Mo surface to a gas-phase oxidizing agent, such as ozone. Ozone, being both more oxidizing and more reactive than molecular oxygen, forms a different self-limiting oxide compared to the layer formed on air exposure. In particular, ozone exposure forms a self-limiting molybdenum trioxide ($MoO_3$) layer on the exposed Mo surface. After oxidation, the self-limiting molybdenum trioxide ($MoO_3$) layer can be selectively removed by ligand-assisted dissolution in an appropriate solvent.

One good ligand choice for the Mo etch process is α-benzoin oxime. The α-benzoin oxime ligand selectively binds to $Mo^{6+}$ ions, so $MoO_3$ will react with the ligand to form a molybdenum α-benzoin oximate (i.e., a ligand-metal complex), while metallic molybdenum will not react. This chemical selectivity allows ligand binding and dissolution to be accomplished in single solvent (such as, e.g. dimethyl sulfoxide (DMSO)). By exposing the $MoO_3$ surface layer to a solution of α-benzoin oxime dissolved in DMSO, the $MoO_3$ surface layer is converted to a molybdenum α-benzoin oximate, which is then dissolved in the DMSO. In this example, the ligand binding and dissolution step is self-limiting because metallic molybdenum does not react with α-benzoin oxime. For other non-selective ligands, self-limiting behavior can be maintained by separating the ligand binding and dissolution into sequential steps using a different solution (i.e., a different liquid solvent 135 and 145) for each process step.

Figure 2A:
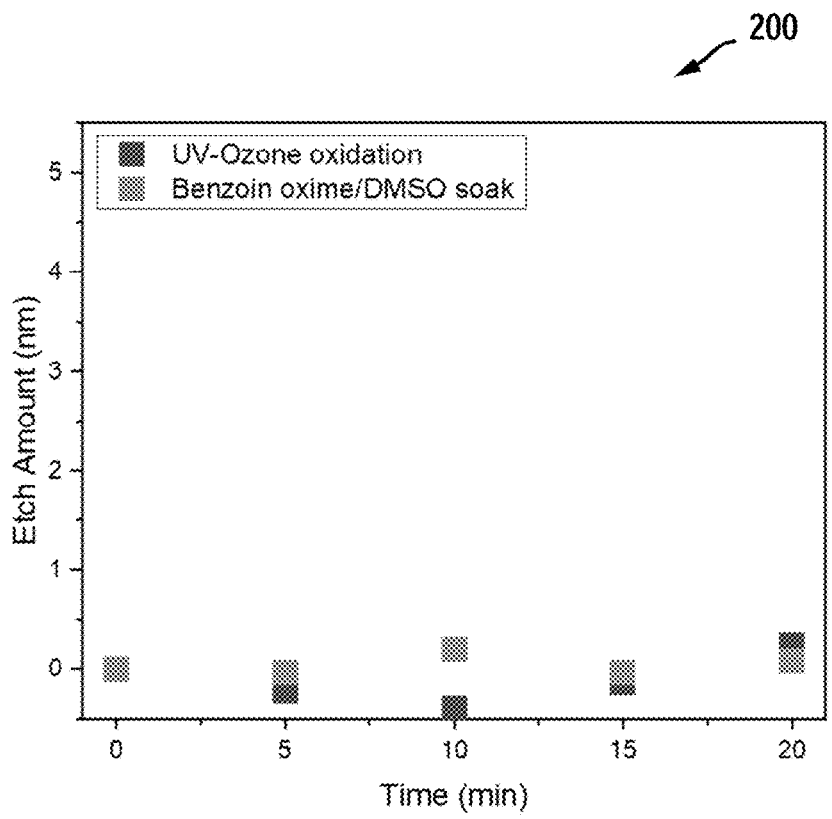
FIG. 2A is a graph depicting exemplary etch amounts (expressed in nanometers, nm) that may be achieved over time (expressed in minutes, min) when attempting to etch a molybdenum (Mo) surface using: (a) UV-ozone oxidation alone, and (b) a solution of α-benzoin oxime and DMSO.

The self-limiting and selective behavior of the individual reaction steps described above is shown in FIG. 2A. More specifically, FIG. 2A illustrates a graph 200 depicting exemplary etch amounts (expressed in nanometers, nm) that may be achieved over time (expressed in minutes, min) when attempting to etch a molybdenum (Mo) surface using: (a) UV-ozone oxidation alone, and (b) a solution of α-benzoin oxime and DMSO. As shown in FIG. 2A, the Mo surface will not etch even after 20 minutes of exposure to ozone in a UV-ozone cleaner. This shows that the reaction between Mo and ozone is self-limiting at room temperature. Similarly, a Mo surface will not etch in an α-benzoin oxime solution in DMSO. No etching is observed even after 20 minutes of exposure. This shows that α-benzoin oxime will not react with metallic or low oxidation state Mo.

Figure 2B:
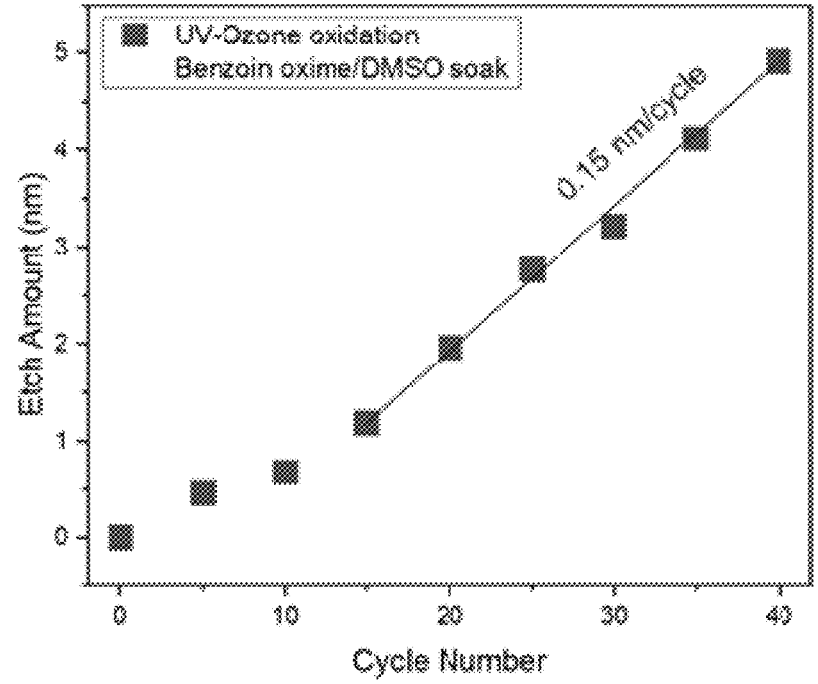
FIG. 2B is a graph depicting exemplary etch amounts (nm) that may be achieved as a function of cycle number for when a UV-ozone oxidation step, an α-benzoin oxime ligand binding (complexation) step and DMSO dissolution step are used to etch a Mo surface using the hybrid ALE process disclosed herein

FIG. 2B illustrates a graph 250 depicting exemplary etch amounts (nm) that may be achieved as a function of cycle number for when a UV-ozone oxidation step, an α-benzoin oxime ligand binding (complexation) step and a DMSO dissolution step are used to etch a Mo surface using the hybrid ALE process disclosed herein. In the example shown in FIG. 2B, one ALE cycle consists of placing the Mo coupon in a UV-ozone cleaner for 1 minute followed by a 10 second dip in a 50 mM α-benzoin oxime solution in DMSO. Excess DMSO and unbound α-benzoin oxime (complexing agent) was removed with an acetone rinse and the coupon was then dried using compressed air. In another example, another drying gas may be used, for example nitrogen ($N_2$). The thickness of the Mo layer was calculated from 4-point probe resistivity measurements conducted every 5 cycles. As shown in FIG. 2B, the etching is substantially linear with cycle number after the first nanometer of etching. Etching was observed for samples exposed to both UV and ozone, as well as ozone alone, during the oxidation step. This indicates that ozone is necessary for the Mo hybrid ALE process, but UV illumination is not. FIGS. 2A and 2B further show that no Mo material is removed by exposure to either reactant alone (FIG. 2A), but Mo material is removed (FIG. 2B) with the cyclic hybrid ALE process shown in FIG. 1 and described herein.

The hybrid ALE process shown in FIG. 1 causes smoothing of the etched surface. To observe the etched surface, scanning electron microscope (SEM) images of an as-deposited Mo film and a Mo film etched using the hybrid ALE scheme described above were obtained. No pitting or preferential grain boundary etching was observed in the etched sample. Additionally, the thickness of the etched sample calculated from 4-point probe resistivity measurements was observed to match the thickness measured in the SEM cross section. While the roughness of the Mo film did not increase during etching using the hybrid ALE process described above, particulate contamination (likely from the acetone rinse step) was observed.

The hybrid ALE process described herein may be used for etching a wide variety of materials including polycrystalline materials, single-crystalline materials and amorphous materials. In some embodiments, the hybrid ALE process described herein may be used for etching a polycrystalline material, such as a transition metal (e.g., molybdenum, Mo), and a gas-phase oxidizing agent (e.g., oxygen, $O_2$, or ozone, $O_3$) may be used to oxidize an exposed surface of the transition metal to form a self-limiting oxidized layer (such as, e.g., $MoO_3$), as described above. The oxidation of transition metals, such as molybdenum, is self-limiting when performed at (or near) room temperature. After the exposed surface of the transition metal is exposed to the gas-phase oxidizing agent and the self-limiting oxidized layer is formed, one or more liquid-phase reactants may be dispensed onto the surface of the substrate to selectively dissolve the self-limiting oxidized layer, so that the self-limiting oxidized layer is removed without etching the underlying polycrystalline material. Several different chemistries can be used to selectively dissolve molybdenum oxides (e.g., $MoO_3$) without dissolving metallic Mo are described in more detail below.

In some embodiments, for example, a $MoO_3$ surface layer may be exposed to a ligand (such as α-benzoin oxime) dissolved in a non-aqueous solution (such as DMSO). When exposed to α-benzoin oxime dissolved in DMSO, the $MoO_3$ surface layer is converted to a molybdenum α-benzoin oximate, which is then dissolved in the DMSO. In addition to DMSO, however, α-benzoin oxime is soluble in water, alcohol, acetone, methyl-ethyl ketone (MEK), and other ketones. The α-benzoin oxime ligand selectively binds to $Mo^{6+}$ ions, including the $MoO_3$ surface layer, to form a Mo-α-benzoin oxime complex, which is soluble in acetone, DMSO, and other ketones, but not in alcohol or water. This chemical selectivity allows ligand binding and dissolution to be accomplished in a single solvent containing acetone, DMSO, and other ketones, for example. Alternatively, the ligand binding and dissolution can be performed in sequential, non-overlapping steps, using for example water or alcohol in a first step, and acetone, DMSO, and other ketones, in a second sequential step.

In addition to α-benzoin oxime, other ligands can be used to selectively bind to $Mo^{6+}$ to form an alternative ligand-metal complex without binding to metallic molybdenum (Mo) or low oxidation state Mo. Examples of such ligands include, but are not limited to, toluene dithiol, cupferron and 8-hydroxyquinoline. Like α-benzoin oxime, these ligands selectively bind to $Mo^{6+}$ to form a ligand-metal complex, which is soluble in non-aqueous solutions. For example, the Mo-toluene dithiol complex is soluble in acetates (e.g. ethyl, butyl, and amyl acetate), and carbon tetrachloride. Toluene dithiol, but not the Mo complex is soluble in aqueous solutions and alcohols. The Mo-cupferron complex is soluble in chloroform, concentrated nitric acid, or concentrated ammonium hydroxide. Cupferron but not the Mo complex is soluble in neutral aqueous solutions. The Mo-8-hydroxyquinoline complex is soluble in concentrated mineral acids. 8-hydroxyquinoline, but not the Mo complex is soluble in ethanol, acetone, chloroform, and benzene. Any of the ligands mentioned above may be used in the ligand binding followed by dissolution method described above to selectively dissolve the $MoO_3$ surface layer.

Reactive dissolution of the $MoO_3$ surface layer can also be accomplished in aqueous solutions. For example, concentrated hydrochloric acid (HCl) may be used to dissolve molybdenum oxides selectively to metallic Mo. The measured Mo etch rate for 0.1M, 1M, 5M, and 12M HCl is below normal detection thresholds (e.g., <0.01 nm/min). These same concentrations of HCl will dissolve a monolayer of $MoO_3$ in <2 sec, giving a selectivity of more than 800:1. In addition to HCl, other mineral acids (such as sulfuric acid) may be used to dissolve molybdenum oxides. In some cases, sulfuric acid ($H_2SO_4$) may be preferred over HCl from a materials compatibility perspective. The availability of HCl and sulfuric acid (and other mineral acids) at high purity and low cost, their use in many other semiconductor processes, and their performance in the selective removal of $MoO_3$ ensure that mineral acids are one of the preferred aqueous chemistries used for the selective dissolution of $MoO_3$ in the hybrid ALE process described herein. Concentrated ammonium hydroxide ($NH_4OH$) can also be used to dissolve molybdenum oxides, however, the selectivity versus metallic Mo is not as good as for concentrated $NH_4OH$ as it is for HCl.

Using aqueous chemistries for the selective dissolution of $MoO_3$ provides several advantages. They use inexpensive commodity chemicals, are reasonably environmentally friendly, and lack the flammability risk of organic solvents. However, aqueous solutions of ammonium hydroxide (NH$_4$OH) and concentrated mineral acids (such as HCl) will react with many different metals. This may cause selectivity concerns if multiple metals are present on the wafer surface during Mo etch. This leads to the advantage of the non-aqueous chemistries, namely that ligand-metal complexation can be very selective between metals. For example, α-benzoin oxime is very selective to Mo$^{6+}$ over most other metals. It is used in quantitative analysis to separate Mo from solutions containing many other metal ions. However, the advantage of selectivity from using these ligands comes at the expense of additional chemical cost and flammability risk of using organic solvents.

Although described above for Mo etching, one skilled in the art would readily understand how the hybrid ALE process shown in FIG. 1 may be used for etching other transition metals. For example, α-benzoin oxime binds to other ions as well as molybdenum. This includes ligand-metal complexes with tungsten, palladium, vanadium, niobium, tantalum, and chromium. There will be inherent selectivity with other metals that do not bind with α-benzoin oxime. Selectivity to other metals that complex with α-benzoin oxime can still be achieved. While α-benzoin oxime will bind to the transition metals listed above, the solubility of the ligand-metal complexes created with such metals are different for different solutions. While molybdenum oximate is soluble in DMSO, for example, tungsten oximate is not, so selectivity is achieved during the dissolution step. However, both molybdenum and tungsten oximate complexes are soluble in chloroform.

Room temperature processing is a big advantage of wet and hybrid ALE over thermal ALE. This advantage stems from the mechanism by which the modified layer is removed. In thermal ALE, the modified layer is removed through volatilization when material is taken from the solid phase into the gas phase. This phase change requires the addition of latent heat and is limited by the vapor pressure of the modified layer. Thermal energy is used to replace the intermolecular interactions that stabilize the modified layer on the surface, so high temperatures are often required to remove the modified layer.

Unlike thermal ALE, the modified layer is dissolved into solution in wet and hybrid ALE. This process creates a solvation shell around the molecules as they dissolve. Interactions between solvent and solute replace the intermolecular interactions in the solid. This solvation energy, rather than thermal energy, drives the dissolution. The fundamental difference in energy required for dissolution compared to vaporization explains why wet and hybrid ALE is viable at room temperature while thermal ALE is not. As solvation energy strongly depends on the solvent species, an appropriate solvent must be chosen to dissolve the modified layer in the hybrid ALE process described herein. For surfaces made of multiple materials, the different solvation energies for the different components provides another pathway to derive selectivity.

While the hybrid ALE process described herein can be accomplished using many different process chambers, tools and apparatuses, the processing equipment used to perform the hybrid ALE process is preferably capable of running at (or near) room temperature and at (or near) atmospheric pressure. In one example implementation, the hybrid ALE process described herein may be performed within a spin chamber. When a spin chamber is utilized, liquid-phase reactants are dispensed from a nozzle positioned over the substrate and are distributed by the rotational motion of a spin chuck on which the substrate is disposed. Gas-phase reactants (e.g., a gas-phase oxidizing agent, such as oxygen or ozone) can also be dispensed from a nozzle, which can be translated over the entire substrate surface to ensure the whole surface receives an equivalent dose of the gas-phase reactant. Alternatively, gas-phase reactants may be dispensed from a gas inlet, which introduces the gas-phase reactants into the spin chamber to create an oxygen-containing gaseous environment. The use of gas-phase reactants requires the spinner (otherwise referred to as a spin chuck) to be contained in a gas-tight enclosure with an exhaust outlet and appropriate exhaust remediation such as an ozone destruct module. In some embodiments, the spinner may be housed in a gas-tight enclosure that contains a static pressure of the gas-phase reactant.

Figure 3A:
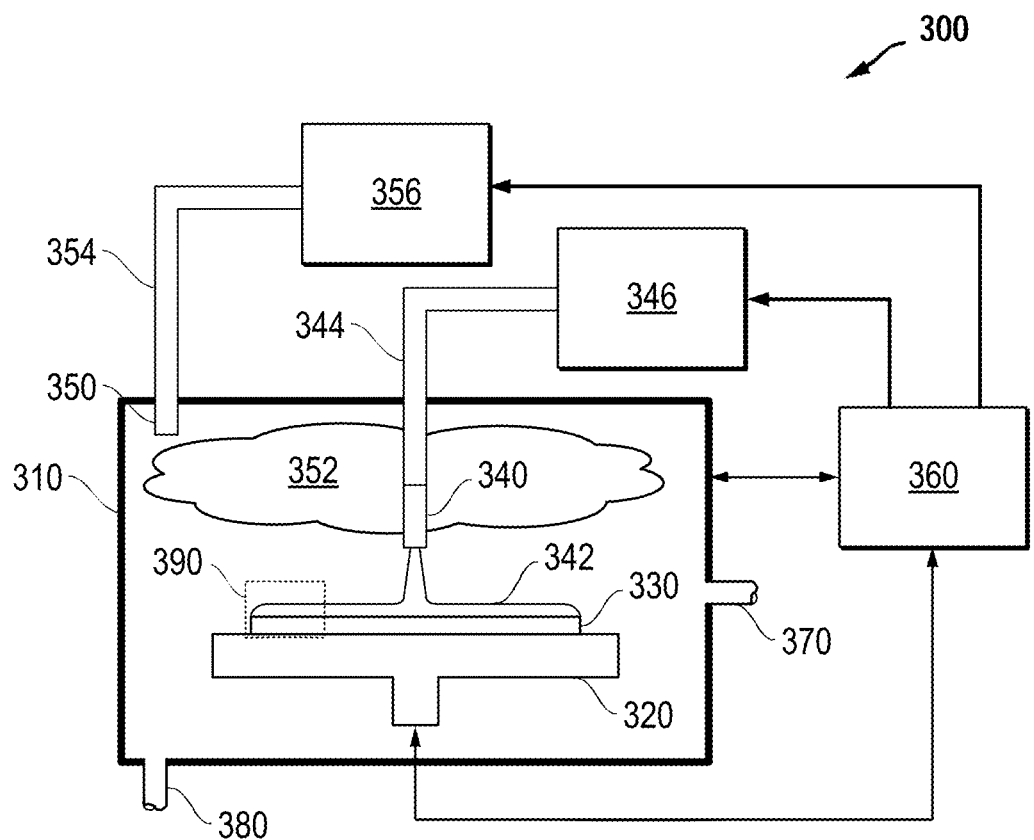
FIG. 3A is a block diagram illustrating one embodiment of a processing system may use the hybrid ALE process disclosed herein to etch a material on a surface of a substrate.

FIG. 3A illustrates one embodiment of a processing system 300 that may use the hybrid ALE techniques described herein to etch a material on a surface of a substrate 330. As shown in FIG. 3A, the processing system 300 includes a process chamber 310, which in some embodiments, may be a pressure controlled chamber. In the embodiment shown in FIG. 3A, the process chamber 310 is a spin chamber having a spinner 320 (or spin chuck), which is configured to spin or rotate at a controlled speed. A substrate 330 is held on the spinner 320, for example, via electrostatic force or vacuum pressure. In one example, the substrate 330 may be a semiconductor wafer having a material (such as, e.g., a polycrystalline material) formed on or within the substrate 330.

The processing system 300 shown in FIG. 3A further includes a nozzle 340, which is positioned over the substrate 330 for dispensing liquid-phase reactants 342 onto a surface of the substrate 330, and a gas inlet 350 for introducing gas-phase reactants 352 into the process chamber 310. In some embodiments, the polycrystalline material formed on or within the substrate 330 may be a transition metal (such as, e.g., molybdenum, Mo) and a gas-phase reactant 352, such as a gas-phase oxidizing agent (such as, e.g., O$_2$ or O$_3$), may be introduced into the process chamber 310 via the gas inlet 350 to create an oxygen-containing gaseous environment. The oxygen-containing gaseous environment oxidizes exposed surfaces of the transition metal to form a self-limiting oxidized layer (such as, e.g., MoO$_3$). After the oxidized layer is formed, one or more liquid-phase reactants 342 may be dispensed onto the surface of the substrate 330 via the nozzle 340 to selectively dissolve the oxidized layer, so that the oxidized layer is removed without etching the underlying polycrystalline material. Examples of liquid-phase reactants 342 that may be used to selectively bind with and dissolve the oxidized layer are discussed in more detail above.

The liquid-phase reactant(s) 342 may be stored within a chemical supply system 346, which may include one or more reservoirs for holding the various liquid-phase reactant(s) 342 and a chemical injection manifold, which is fluidly coupled to the process chamber 310 via a liquid supply line 344. In operation, the chemical supply system 346 may selectively apply desired chemicals to the process chamber 310 via the liquid supply line 344 and the nozzle 340 positioned within the process chamber 310. Thus, the chemical supply system 346 can be used to dispense the liquid-phase reactant(s) 342 onto the surface of the substrate 330.

The gas-phase reactants 352 may be stored within a gas supply system 356, which may include one or more reservoirs for holding the various gas-phase reactants 352 and a gas injection manifold, which is coupled to the process chamber 310 via a gas supply line 354. In operation, the gas supply system 356 may selectively apply a desired gas-phase reactant to the process chamber 310 via the gas supply line 354 and the gas inlet 350 positioned within the process chamber 310. Thus, the gas supply system 356 can be used to introduce gas-phase reactants 352 into the process chamber 310.

Because gas-phase reactants 352 are used, process chamber 310 may comprise a gas-tight enclosure, which is capable of maintaining a static pressure of the gas-phase reactant. The process chamber 310 may further include a gas exhaust outlet 370 for removing the gas-phase reactants 352 and a drain 380 for removing the liquid-phase reactants 342 from the process chamber 310. In some embodiments, the gas exhaust outlet 370 may be coupled to an appropriate exhaust remediation (not shown), such as an ozone destruct module.

Components of the processing system 300 can be coupled to, and controlled by, a controller 360, which in turn, can be coupled to a corresponding memory storage unit and user interface (not shown). Various processing operations can be executed via the user interface, and various processing recipes and operations can be stored in a storage unit. Accordingly, a given substrate 330 can be processed within the process chamber 310 in accordance with a particular recipe. In some embodiments, a given substrate 330 can be processed within the process chamber 310 in accordance with an etch recipe that utilizes the hybrid ALE techniques described herein.

The controller 360 shown in block diagram form in FIG. 3A can be implemented in a wide variety of manners. In one example, the controller 360 may be a computer. In another example, the controller 360 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

As shown in FIG. 3A, the controller 360 may be coupled to various components of the processing system 300 to receive inputs from, and provide outputs to, the components. For example, the controller 360 may be coupled to: the process chamber 310 for controlling the temperature and/or pressure within the process chamber 310; the spinner 320 for controlling the rotational speed of the spinner 320; the chemical supply system 346 for controlling the various liquid-phase reactants 342 dispensed onto the substrate 330; and the gas supply system 356 for controlling the various gas-phase reactants 352 introduced into the process chamber 310.

In some embodiments, the controller 360 may control the various components of the processing system 300 in accordance with an etch recipe that utilizes the hybrid ALE techniques described herein. For example, the controller 360 may supply various control signals to the gas supply system 356, which cause the gas supply system 356 to introduce a gas-phase reactant 352 into the process chamber 310 to create a modified surface layer on the substrate 330. Likewise, the controller 360 may supply various control signals to the chemical supply system 346, which cause the chemical supply system 346 to dispense one or more liquid-phase reactants 342 onto the surface of the substrate 330 to selectively dissolve the modified surface layer without dissolving the material underlying the modified surface layer. Example gas-phase reactants 352 and liquid-phase reactants 342 for modifying an exposed surface of a polycrystalline molybdenum (Mo) material and selectively dissolving the modified Mo surface layer are discussed above.

Once the modified surface layer is selectively dissolved, the substrate 330 may be dried and the gas-phase surface modification and liquid-phase dissolution steps may be repeated for one or more ALE cycles until a desired amount of the polycrystalline material is etched. In some embodiments, the controller 360 may supply control signals to the spinner 320 and/or the chemical supply system 346 to dry the substrate 330. In one example, the controller 360 may control the rotational speed of the spinner 320, so as to dry the substrate 330 in a spin dry step. In another example, control signals supplied from the controller 360 to the chemical supply system 346 may cause a drying agent (such as, e.g., isopropyl alcohol) to be dispensed onto the surface of the substrate 330 to further assist in drying the substrate before performing the spin dry step.

In some embodiments, the gas-phase surface modification, liquid-phase dissolution and spin dry steps of the hybrid ALE process described herein may each be performed within the same process chamber 310 at roughly the same temperature and pressure. In one example implementation, the gas-phase surface modification, liquid-phase dissolution and spin dry steps may be performed at (or near) atmospheric pressure and room temperature. Performing the processing steps within the same process chamber at roughly the same temperature and pressure decreases the cycle time and improves the throughput of the hybrid ALE process described herein by avoiding unnecessary chamber transitions and temperature/pressure changes.

It is noted, however, that the embodiments described herein are not strictly limited to only atmospheric pressure and room temperature, nor are they limited to a particular process chamber. In other embodiments, one or more processing steps of the hybrid ALE process described herein can be run at above atmospheric pressure in a pressure vessel, or at reduced pressure in a vacuum chamber. Liquid-phase reactants can be dispensed in these environments as long as the vapor pressure of the liquid is lower than the chamber pressure. For these implementations, a spinner with a liquid dispensing nozzle would be placed in the pressure vessel or vacuum chamber. The temperature of the liquid being dispensed can be elevated to any temperature below its boiling point at the pressure of the process. Higher liquid temperatures can increase the kinetics of dissolution.

In some embodiments of the hybrid ALE process described herein, the substrate 330 may be exposed to gas-phase reactant(s) 352 and liquid-phase reactant(s) 342 in sequence. In other embodiments, however, the substrate 330 may be exposed to one or more liquid-phase reactants 342 while a gas-phase reactant 352 is supplied to the process chamber 310. When a liquid-phase reactant 342 is dispensed in the presence of a gas-phase reactant 352, the liquid-phase reactant 342 dispensed onto the surface of the substrate 330 displaces the gas-phase reactant 352 from the surface to prevent further modification of the surface. When dispensed in such a manner, the liquid-phase reactant 342 not only dissolves the modified surface layer, but also partitions the gas-phase surface modification and liquid-phase dissolution steps. This is shown schematically in FIG. 3B and further improves the cycle time and throughput of the hybrid ALE process described herein, compared to other ALE techniques, by avoiding the need to perform a purge step between the surface modification and dissolution steps.

Figure 3B:
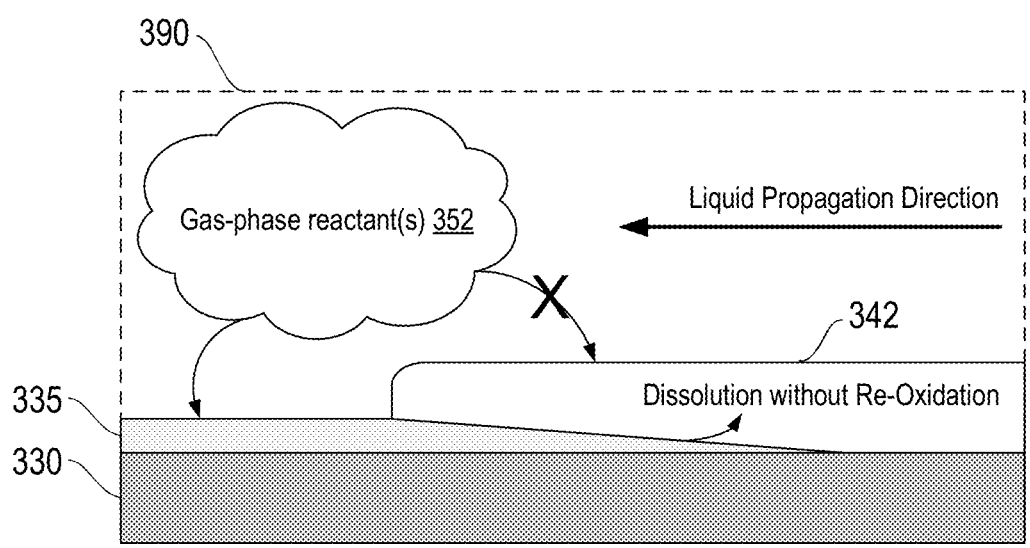
FIG. 3B is a magnified view of a portion of the substrate shown in FIG. 3A illustrating how the gas-phase surface modification and liquid-phase dissolution steps are partitioned within the hybrid ALE process disclosed herein.

A magnified view of a portion 390 of the substrate 330 is shown in FIG. 3B to illustrate the partitioning of the gas-phase surface modification and liquid-phase dissolution steps. In the hybrid ALE process described herein, gas-phase reactant(s) 352 are introduced into the process chamber 310 to create, for example, an oxygen-containing gaseous environment. The gas-phase reactant(s) 352 react with exposed surfaces of the substrate 330 to form a self-limiting modified surface layer 335. Next, one or more liquid-phase reactants 342 are dispensed onto the surface of the substrate 330 in the presence of the gas-phase reactant 352 while the spinner 320 is rotating. As spinner 320 rotates, the liquid-phase reactant(s) 342 propagate outward (in the direction shown in FIG. 3B) to dissolve the modified surface layer 335. The liquid-phase reactant(s) 342 prevent the gas-phase reactant 352 from reaching the surface of the substrate 330, and thus, provide dissolution of the modified surface layer 335 while preventing underlying portions of the substrate 330 from being re-oxidized.

As the liquid-phase reactant(s) 342 propagate outward (in the direction shown in FIG. 3B), the gas-phase reactant(s) 352 are displaced from the surface of the substrate 330. This displacement happens because the liquid-phase reactant(s) 342 create a continuous film on the surface that makes it difficult or substantially prevents the gas-phase reactant(s) 352 from reaching the surface of the substrate 330. For example, the gas-phase reactants 352 must diffuse through the liquid-phase reactant(s) 342 to reach the surface of the substrate 330. Once the modified surface layer 335 is dissolved by the liquid-phase reactant(s) 342, however, the liquid-phase reactant(s) 342 can be flushed from the surface of the substrate 330 to re-expose the surface to the gas-phase reactant(s) 352 and create a new modified surface layer. Exposure to the gas-phase reactant(s) 352 can be accomplished, in some embodiments, by spin-drying the substrate 330. Because the liquid-phase reactant(s) 342 can be flushed from the surface of the substrate 330 at a rate faster than the diffusion timescale of the gas-phase reactant(s) 352 into the liquid, the cyclic dispensing of the liquid-phase reactant(s) 342 effectively partitions the gas-phase surface modification and liquid-phase dissolution steps.

The techniques described herein offer multiple advantages over other etch techniques. For example, the techniques described herein provide the benefits of ALE, such as precise control of total etch amount, control of surface roughness, and improvements in wafer-scale uniformity. The techniques described herein also provide various benefits of wet etching, such as the simplicity of the etch chamber, self-limiting reactions at (or near) atmospheric pressure and room temperature etching conditions, and reduced surface roughness.

Unlike conventional wet ALE processes, which tend to be slow, the techniques described herein provide a hybrid ALE process that improves cycle time and throughput by combining a gas-phase surface modification step with a liquid-phase dissolution step. As noted above, cycle time and throughput are improved in the hybrid ALE process described herein by performing the gas-phase surface modification and liquid-phase dissolution steps in the same process chamber at roughly the same temperature and pressure. In some embodiments, cycle time and throughput are further improved by dispensing the liquid-phase reactant(s) onto a surface of the substrate in the presence of the gas-phase reactant(s), so that the liquid-phase reactant(s) displace the gas-phase reactant(s) from the surface and partition the gas-phase surface modification and liquid-phase dissolution steps.

Figure 4:
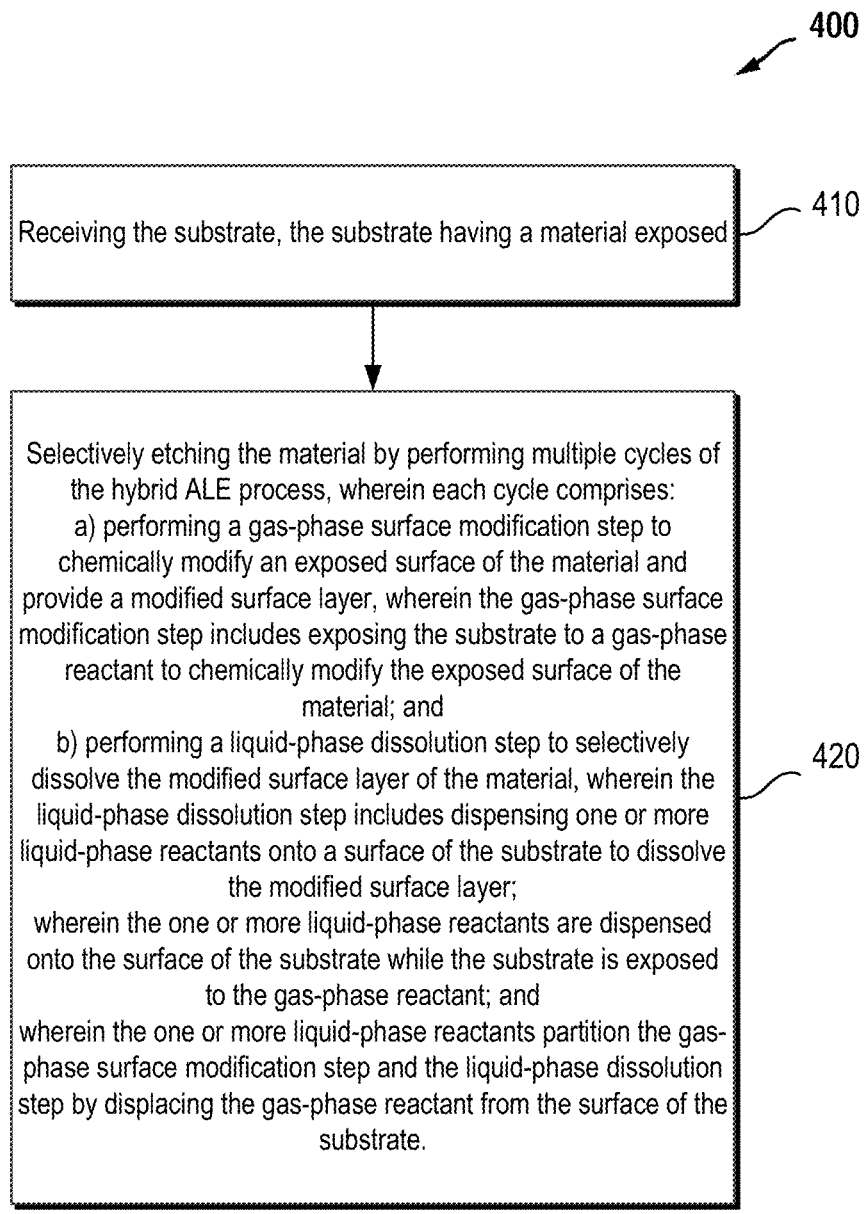
FIG. 4 is a flowchart diagram illustrating one embodiment of a method utilizing the techniques described herein.
Figure 5:
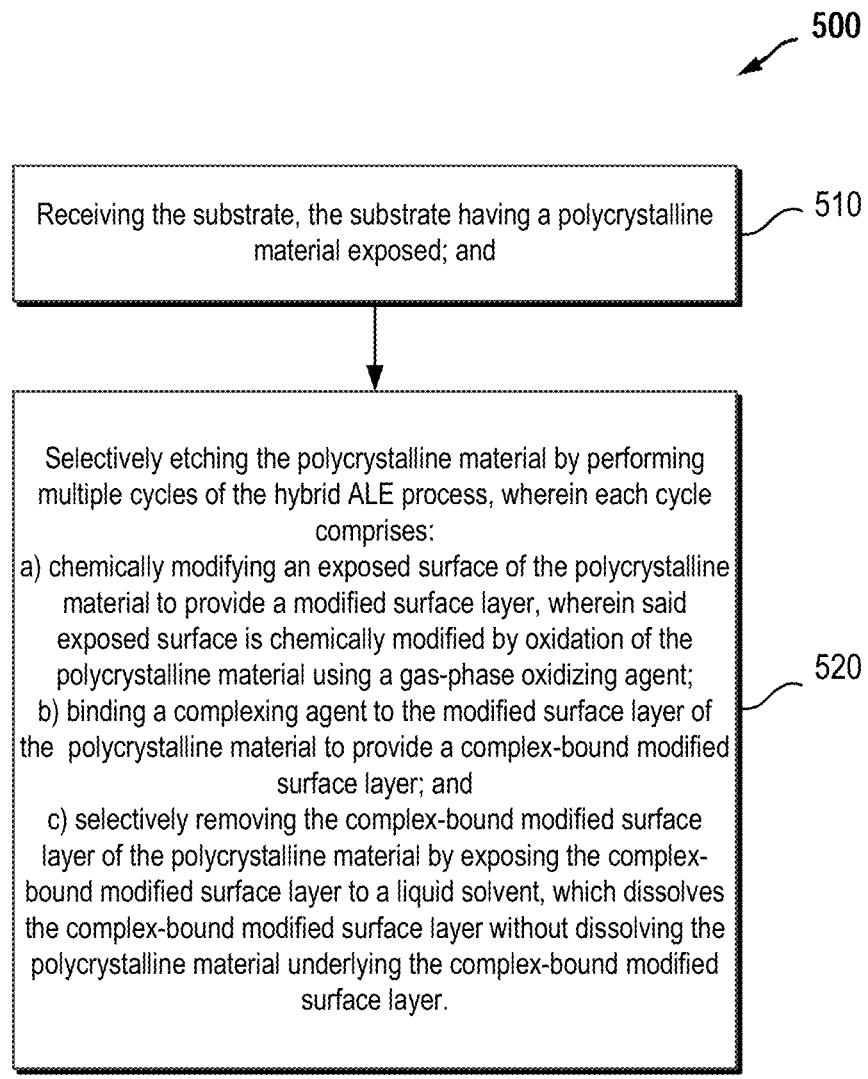
FIG. 5 is a flowchart diagram illustrating another embodiment of a method utilizing the techniques described herein.
Figure 6:
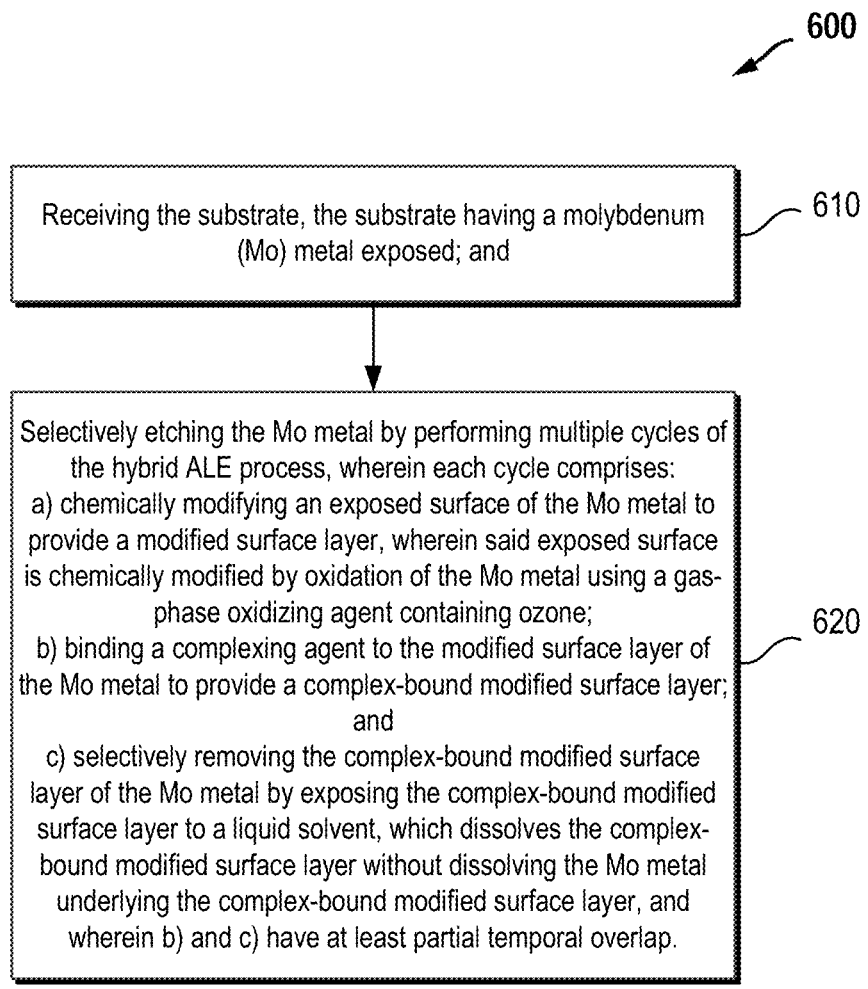
FIG. 6 is a flowchart diagram illustrating yet another embodiment of a method utilizing the techniques described herein.

FIGS. 4-6 illustrate exemplary methods that use the hybrid ALE techniques described herein. More specifically, FIGS. 4-6 illustrate various embodiments of methods used to provide a hybrid ALE process, which maintains the advantages of wet ALE, while avoiding the disadvantages thereof, by combining a gas-phase surface modification step with a liquid-phase dissolution step for etching a substrate disposed within a process chamber. It will be recognized that the embodiments of FIGS. 4-6 are merely exemplary and additional methods may utilize the hybrid ALE techniques described herein. Further, additional processing steps may be added to the methods shown in the FIGS. 4-6 as the steps described are not intended to be exclusive. Moreover, the order of the steps is not limited to the order shown in the figures as different orders may occur and/or various steps may be performed in combination or at the same time.

FIG. 4 illustrates one embodiment of a method 400 that may be used for etching a substrate using a hybrid atomic layer etching (ALE) process. The method 400 shown in FIG. 4 comprises receiving the substrate, the substrate having a material exposed (in step 410). Then, in step 420, the method 400 includes selectively etching the material by performing multiple cycles of the hybrid ALE process, wherein each cycle comprises: (a) performing a gas-phase surface modification step to chemically modify an exposed surface of the material and provide a modified surface layer, wherein the gas-phase surface modification step includes exposing the substrate to a gas-phase reactant to chemically modify the exposed surface of the material; and (b) performing a liquid-phase dissolution step to selectively dissolve the modified surface layer of the material, wherein the liquid-phase dissolution step includes dispensing one or more liquid-phase reactants onto a surface of the substrate to dissolve the modified surface layer. In the method 400 shown in FIG. 4, the one or more liquid-phase reactants are dispensed onto the surface of the substrate while the substrate is exposed to the gas-phase reactant. In such a method, the one or more liquid-phase reactants partition the gas-phase surface modification step and the liquid-phase dissolution step by displacing the gas-phase reactant from the surface of the substrate.

FIG. 5 illustrates another embodiment of a method 500 that may be used for etching a substrate using a hybrid atomic layer etching (ALE) process. The method 500 shown in FIG. 5 comprises receiving the substrate, the substrate having a polycrystalline material exposed (in step 510). Then, in step 520, the method 500 includes selectively etching the polycrystalline material by performing multiple cycles of the hybrid ALE process, wherein each cycle comprises: (a) chemically modifying an exposed surface of the polycrystalline material to provide a modified surface layer, wherein said exposed surface is chemically modified by oxidation of the polycrystalline material using a gas-phase oxidizing agent; (b) binding a complexing agent to the modified surface layer of the polycrystalline material to provide a complex-bound modified surface layer; and (c) selectively removing the complex-bound modified surface layer of the polycrystalline material by exposing the complex-bound modified surface layer to a liquid solvent, which dissolves the complex-bound modified surface layer without dissolving the polycrystalline material underlying the complex-bound modified surface layer.

FIG. 6 illustrates yet another embodiment of a method 600 that may be used for etching a substrate using a hybrid atomic layer etching (ALE) process. The method 600 shown in FIG. 6 comprises receiving the substrate, the substrate having a molybdenum (Mo) metal exposed (in step 610). Then, in step 620, the method 600 includes selectively etching the Mo metal by performing multiple cycles of the hybrid ALE process, wherein each cycle comprises: (a) chemically modifying an exposed surface of the Mo metal to provide a modified surface layer, wherein said exposed surface is chemically modified by oxidation of the Mo metal using a gas-phase oxidizing agent containing ozone; (b) binding a complexing agent to the modified surface layer of the Mo metal to provide a complex-bound modified surface layer; and (c) selectively removing the complex-bound modified surface layer of the Mo metal by exposing the complex-bound modified surface layer to a liquid solvent, which dissolves the complex-bound modified surface layer without dissolving the Mo metal underlying the complex-bound modified surface layer, and wherein b) and c) have at least partial temporal overlap.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the hybrid ALE techniques are described herein with reference to specific embodiments, various modifications and changes can be made without departing from the scope of the present disclosure. Accordingly, the specification and figures are to be regarded in an illustrative rather than a restrictive sense, and such modifications are intended to be included within the scope of the present disclosure. Further, any benefits, advantages, or solutions to problems that are described herein with regard to specific embodiments are not intended to be construed as a critical, required, or essential feature or element of any or all the claims.

What is claimed is:

1. A method of etching a substrate using a hybrid atomic layer etching (ALE) process, the method comprising:
   receiving the substrate, the substrate having a material exposed; and
   selectively etching the material by performing multiple cycles of the hybrid ALE process, wherein each cycle comprises:
   a) performing a gas-phase surface modification step to chemically modify an exposed surface of the material and provide a self-limited modified surface layer on the material, wherein the gas-phase surface modification step includes exposing the substrate to a gas-phase oxidizing reactant to oxidize the exposed surface of the material and form a self-limited oxidized layer on the material via a self-limiting oxidation reaction, and wherein the self-limited oxidized layer is a passivation layer formed on the material; and
   b) performing a liquid-phase dissolution step to selectively dissolve the self-limited oxidized layer of the material, wherein the liquid-phase dissolution step includes dispensing one or more liquid-phase reactants onto a surface of the substrate to dissolve the self-limited oxidized layer, wherein said dispensing the one or more liquid-phase reactants comprises dispensing a complexing agent dissolved in a first liquid solvent onto the surface of the substrate, and wherein the complexing agent binds to the self-limited oxidized layer to form a complex-bound modified surface layer on the material;

wherein the one or more liquid-phase reactants are dispensed onto the surface of the substrate while the substrate is exposed to the gas-phase oxidizing reactant;

wherein the one or more liquid-phase reactants partition the gas-phase surface modification step and the liquid-phase dissolution step by displacing the gas-phase oxidizing reactant from the surface of the substrate;

wherein the self-limited oxidized layer formed via the self-limiting oxidation reaction forms the passivation layer on the material that prevents further oxidation of the exposed surface of the material before the one or more liquid-phase reactants are dispensed onto the surface of the substrate; and wherein steps a)-b) are repeated one or more times until a desired amount of the material is removed from the substrate.

2. The method of claim 1, wherein the material includes a transition metal.

3. The method of claim 1, wherein said dispensing the one or more liquid-phase reactants comprises dispensing a second liquid solvent onto the surface of the substrate to dissolve the complex-bound modified surface layer and remove the self-limited oxidized layer.

4. The method of claim 3, wherein the first liquid solvent and the second liquid solvent are the same.

5. The method of claim 3, wherein the first liquid solvent and the second liquid solvent are different solvents.

6. The method of claim 1, wherein each cycle further comprises drying the surface of the substrate after the liquid-phase dissolution step is performed to selectively dissolve the complex-bound modified surface layer of the material.

7. The method of claim 6, wherein said drying the surface of the substrate comprises spin-drying the substrate to flush the one or more liquid-phase reactants from the surface of the substrate and re-expose the exposed surface of the material to the gas-phase reactant in a subsequent gas-phase surface modification step.

8. A method of etching a substrate using a hybrid atomic layer etching (ALE) process, comprising:
receiving the substrate, the substrate having a polycrystalline material exposed; and
selectively etching the polycrystalline material by performing multiple cycles of the hybrid ALE process, wherein each cycle comprises:
a) chemically modifying an exposed surface of the polycrystalline material to provide a modified surface layer, wherein said exposed surface is chemically modified by using a gas-phase oxidizing agent to oxidize the polycrystalline material and form a self-limited oxidized layer on the polycrystalline material via a self-limiting oxidation reaction, and wherein the self-limited oxidized layer is a passivation layer formed on the polycrystalline material;
b) binding a complexing agent to the self-limited oxidized layer formed on the polycrystalline material to provide a complex-bound modified surface layer; and
c) selectively removing the complex-bound modified surface layer of the polycrystalline material by exposing the complex-bound modified surface layer to a liquid solvent, which dissolves the complex-bound modified surface layer without dissolving the polycrystalline material underlying the complex-bound modified surface layer;
wherein the self-limited oxidized layer formed via the self-limiting oxidation reaction forms the passivation layer on the polycrystalline material that prevents further oxidation of the polycrystalline material before the complex-bound modified surface layer is exposed to the liquid solvent.

9. The method of claim 8, wherein during each cycle, b) and c) are performed with at least partial temporal overlap.

10. The method of claim 9, wherein the liquid solvent contains the complexing agent, and wherein the complex-bound modified surface layer is soluble in the liquid solvent.

11. The method of claim 8, wherein during each cycle, b) and c) are performed sequentially with no temporal overlap.

12. The method of claim 11, wherein the complexing agent is dissolved in a first liquid solvent, which differs from the liquid solvent used to dissolve the complex-bound modified surface layer, and wherein the complex-bound modified surface layer is insoluble in the first liquid solvent and soluble in the liquid solvent.

13. The method of claim 8, wherein the polycrystalline material includes a transition metal.

14. The method of claim 8, further comprising:
repeating steps a)-c) at least once until a desired amount of the polycrystalline material is removed from the substrate.

15. A method of etching a substrate using a hybrid atomic layer etching (ALE) process, comprising:
receiving the substrate, the substrate having a molybdenum (Mo) metal exposed; and
selectively etching the Mo metal by performing multiple cycles of the hybrid ALE process, wherein each cycle comprises:
a) chemically modifying an exposed surface of the Mo metal to provide a modified surface layer, wherein said exposed surface is chemically modified by using a gas-phase oxidizing agent containing ozone to oxidize the Mo metal and form a self-limited molybdenum oxide layer on the Mo metal via a self-limiting oxidation reaction, and wherein the self-limited molybdenum oxide layer is a passivation layer formed on the Mo metal;
b) binding a complexing agent to the self-limited molybdenum oxide layer formed on the Mo metal to provide a complex-bound modified surface layer; and
c) selectively removing the complex-bound modified surface layer of the Mo metal by exposing the complex-bound modified surface layer to a liquid solvent, which dissolves the complex-bound modified surface layer without dissolving the Mo metal underlying the complex-bound modified surface layer;
wherein the self-limited molybdenum oxide layer formed via the self-limiting oxidation reaction forms the passivation layer that prevents further oxidation of the Mo metal before the complex-bound modified surface layer is exposed to the liquid solvent; and
wherein b) and c) have at least partial temporal overlap.

16. The method of claim 15, further comprising:
repeating steps a)-c) at least once until a desired amount of the Mo metal is removed from the substrate.

17. The method of claim 15, wherein the liquid solvent contains the complexing agent, and wherein the complex-bound modified surface layer is soluble in the liquid solvent.

18. The method of claim 15, further comprising:
d) rinsing the substrate to remove excess liquid solvent and unbound complexing agent; and
e) drying the substrate using a gas stream, a spin dry step and/or a drying agent.

19. The method of claim 18, further comprising:
repeating steps a)-e) at least once until a desired amount of the Mo metal is removed from the substrate.

* * * * *